United States Patent
Plofsky

(10) Patent No.: US 7,539,900 B1
(45) Date of Patent: May 26, 2009

(54) EMBEDDED MICROPROCESSOR FOR INTEGRATED CIRCUIT TESTING AND DEBUGGING

(75) Inventor: Jordan Plofsky, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 825 days.

(21) Appl. No.: 10/629,508

(22) Filed: Jul. 29, 2003

(51) Int. Cl.
*G06F 11/00* (2006.01)

(52) U.S. Cl. .......................................................... 714/30

(58) Field of Classification Search ................... 714/30, 714/31, 32, 37, 43, 733
See application file for complete search history.

(56) References Cited

U.S. PATENT DOCUMENTS

| | | |
|---|---|---|
| 4,527,234 A | 7/1985 | Bellay |
| 4,696,004 A | 9/1987 | Nakajima |
| 4,788,492 A | 11/1988 | Schubert |
| 4,835,736 A | 5/1989 | Easterday |
| 4,847,612 A | 7/1989 | Kaplinsky |
| 4,873,459 A | 10/1989 | El Gamo et al. |
| 5,036,473 A | 7/1991 | Butts et al. |
| 5,058,114 A | 10/1991 | Kuboki et al. |
| 5,124,588 A | 6/1992 | Baltus et al. |
| 5,157,781 A | 10/1992 | Harwood et al. |
| 5,329,470 A | 7/1994 | Sample et al. |
| 5,365,165 A | 11/1994 | El-Ayat et al. |
| 5,425,036 A | 6/1995 | Liu et al. |
| 5,452,231 A | 9/1995 | Butts et al. |
| 5,568,437 A | 10/1996 | Jamal |
| 5,572,712 A | 11/1996 | Jamal |
| 5,629,617 A | 5/1997 | Uhling et al. |
| 5,640,542 A | 6/1997 | Whitsel et al. |
| 5,661,662 A | 8/1997 | Butts et al. |
| 5,717,695 A | 2/1998 | Manela et al. |
| 5,717,699 A | 2/1998 | Haag et al. |

(Continued)

FOREIGN PATENT DOCUMENTS

DE 4042262 7/1992

(Continued)

OTHER PUBLICATIONS

Marantz, Joshua, "Enhanced Visibility and Performance in Functional Verification by Reconstruction", Proceedings of the 35th Annual Conference on Design Automation Conference, pp. 164-169. 1998.

(Continued)

*Primary Examiner*—Nadeem Iqbal
(74) *Attorney, Agent, or Firm*—Weaver Austin Villeneuve & Sampson LLP

(57) ABSTRACT

A technique for embedding a microprocessor into an integrated circuit allows on-chip testing and debugging. The microprocessor present on the chip tests and debugs the rest of the chip. Both testing and debugging of a programmable logic device use an embedded microprocessor. Testing is performed by the device manufacturer using a test system. Debugging is performed by a user using a host computer. A PLD includes programmable logic, an embedded microprocessor and separate memory. Testing or debugging routines, patterns, simulations, etc., are downloaded onto the memory. The microprocessor executes the test or debug routine and uploads results to the test system or host computer. The technique is applicable any integrated circuit that can include an embedded microprocessor and associated memory, such as a PLD, an ASIC, a memory chip, or an analog chip.

26 Claims, 6 Drawing Sheets

U.S. PATENT DOCUMENTS

| | | | |
|---|---|---|---|
| 5,764,079 | A | 6/1998 | Patel et al. |
| 5,821,771 | A | 10/1998 | Patel et al. |
| 5,870,410 | A | 2/1999 | Norman et al. |
| 5,937,190 | A | 8/1999 | Gregory et al. |
| 5,960,191 | A | 9/1999 | Sample et al. |
| 5,983,277 | A | 11/1999 | Heile et al. |
| 6,002,861 | A | 12/1999 | Butts et al. |
| 6,014,334 | A | 1/2000 | Patel et al. |
| 6,016,563 | A | 1/2000 | Fleisher |
| 6,020,758 | A | 2/2000 | Patel et al. |
| 6,104,211 | A | 8/2000 | Alfke |
| 6,107,821 | A | 8/2000 | Kelem et al. |
| 6,157,210 | A | 12/2000 | Zaveri et al. |
| 6,167,561 | A | 12/2000 | Chen et al. |
| 6,182,247 | B1 | 1/2001 | Herrmann et al. |
| 6,195,788 | B1 | 2/2001 | Leaver et al. |
| 6,212,650 | B1 | 4/2001 | Guccione |
| 6,223,148 | B1 | 4/2001 | Stewart et al. |
| 6,247,147 | B1 | 6/2001 | Beenstra et al. |
| 6,259,271 | B1 | 7/2001 | Couts-Martin et al. |
| 6,263,484 | B1 | 7/2001 | Yang |
| 6,286,114 | B1 | 9/2001 | Veenstra et al. |
| 6,317,860 | B1 | 11/2001 | Heile |
| 6,321,369 | B1 | 11/2001 | Heile et al. |
| 6,389,558 | B1 | 5/2002 | Herrmann et al. |
| 6,393,591 | B1 * | 5/2002 | Jenkins et al. ............. 714/725 |
| 6,460,148 | B2 | 10/2002 | Veenstra et al. |
| 6,481,000 | B1 | 11/2002 | Zaveri et al. |
| 6,490,717 | B1 | 12/2002 | Pedersen et al. |
| 6,631,520 | B1 * | 10/2003 | Theron et al. ............. 717/173 |
| 6,704,889 | B2 | 3/2004 | Veenstra et al. |
| 6,754,862 | B1 | 6/2004 | Hoyer et al. |
| 6,794,896 | B1 | 9/2004 | Brebner |
| 6,839,874 | B1 * | 1/2005 | Fang ........................ 714/738 |
| 6,842,865 | B2 * | 1/2005 | Nee et al. .................... 714/28 |
| 6,891,397 | B1 | 5/2005 | Brebner |
| 6,911,841 | B2 | 6/2005 | Lee et al. |
| 6,973,405 | B1 * | 12/2005 | Ansari ........................ 702/117 |
| 7,020,598 | B1 * | 3/2006 | Jacobson ..................... 703/14 |
| 7,024,327 | B1 * | 4/2006 | Dastidar et al. ............. 702/117 |
| 7,030,646 | B1 | 4/2006 | Tyson |
| 7,076,751 | B1 | 7/2006 | Nixon et al. |
| 6,693,452 | B1 | 2/2007 | Ansari et al. |
| 7,269,805 | B1 | 9/2007 | Ansari et al. |
| 7,406,670 | B1 | 7/2008 | Ansari et al. |
| 2003/0110430 | A1 | 6/2003 | Bailis et al. |

FOREIGN PATENT DOCUMENTS

| | | |
|---|---|---|
| EP | 0 762 279 A1 | 3/1997 |

OTHER PUBLICATIONS

Stroud, Charles et al., "Evaluation of FPGA Resources for Built-in Self-test of Programmable Logic Blocks", Proceedings of the 1996 ACM 4th International Symposium on Field-programmable Gate Arrays, p. 107. 1996.

Collins, Robert R., "Overview of Pentium Probe Mode", (www.x86.org/ariticles/problemd/ProbeMode.htm), Aug. 21, 1998, 3 pgs.

Collins, Robert R., "ICE Mode and the Pentium Processor", (www.x86.org/ddj/Nov97/Nov97.htm), Aug. 21, 1986, 6 Pgs.

"PentiumPro Family Developer's Manual", vol. 1: Specifications, Intel® Corporation, 1996, 9 Pgs.

"Pentium® Processor User's Manual", vol. 1, Intel® Corporation, 1993, pp. 3-11.

Xilinx, Inc.; ISE Logic Design Tools: ChipScope.

Synplicity, Inc. "Identify™ RTL Debugger" 2003; p. 1-2.

Altera, SignalTap Analysis in the Quartus II Software Version 2.0; Sep. 2002, ver. 2.1; Altera Corporation.

Praveen K. Jaini and Nur A. Tobua; "Observing Test Response of Embedded Cores through Surround Logic"; 1999 IEEE.

Nur A. Touba and Bahram Pouya; "Testing Embedded Cores Using Partial Isolation Rings"; 1997 IEEE.

U.S. Appl. No. 11/437,285, filed May 18, 2006, Nixon et al.

U.S. Office Action dated Sep. 17, 2008 from U.S. Appl. No. 11/437,285.

* cited by examiner

EMBEDDED MICROPROCESSOR FOR INTEGRATED CIRCUIT TESTING AND DEBUGGING

FIELD OF THE INVENTION

The present invention relates generally to testing and debugging of integrated circuits. More specifically, the present invention relates to a technique of using an embedded microprocessor for such testing and debugging.

BACKGROUND OF THE INVENTION

In the field of electronics various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed.

Often, such PLDs are designed and programmed by a design engineer using an electronic design automation tool that takes the form of a software package. Before a design engineer programs the PLD though, a PLD is tested by its manufacturer using tests such as logic array tests, memory tests, I/O tests, fault coverage tests, etc.

But, as integrated circuits become more and more complex, testing costs become higher and higher. The time and effort involved in testing these PLDs before they are sold to a customer is increasing. Likewise, the complexity of newer PLDs means that it takes more time and effort for a design engineer to debug a PLD. In the course of generating a design for a PLD, programming the PLD and checking its functionality on the circuit board or in the system for which it is intended, it is important to be able to debug the PLD because a design is not always perfect the first time.

One approach to debugging a hardware device within a working system is to use a separate piece of hardware equipment called a logic analyzer to analyze signals present on the pins of a hardware device. Embedding a logic analyzer within the hardware device is another technique used. For example, U.S. Pat. No. 6,182,247 entitled "Embedded Logic Analyzer For A Programmable Logic Device" discloses such a technique, and U.S. Pat. Nos. 6,286,114 and 6,247,147 disclose enhancements. In addition, viewing internal nodes in a device may be performed as disclosed in U.S. patent application Ser. No. 09/802,480. Embedding a logic analyzer into a design is also a technique used in the product "ChipScope ILA" available from Xilinx Inc., of San Jose, Calif. The product "ChipScope Pro" also available from Xilinx uses logic cores built directly into a PLD to allow a user to access internal signals and nodes for debugging.

Although the above techniques are useful, the increasing complexity of integrated circuits slows the speed at which testing and debugging of integrated circuits can occur. For example, during hardware emulation on chip, testing or debugging may be slow. Testing or debugging is slow because of the speed of the external computer being used, the serial port on the device through which data and patterns must be passed, the necessary data gathering on the chip itself, and the presence of any probes used in the device. All these factors contribute to an emulation that becomes slower as chip complexity increases. One technique used for emulation available from Cadence and Synopsys involves a huge array of FPGAs in a hardware box. Numerous microprocessors load the FPGAs in order to simulate a hardware device for emulation. These emulation machines though, are extremely expensive.

A software simulation of an integrated circuit is also effected by increasing device complexity. During simulation, a software representation of the chip on a host computer is stimulated to produce outputs. Because the simulation model might be inaccurate, extensive testing is needed. Further, the host computer itself may be slow. Thus, the more complex the device, the slower the simulation goes.

What is desired is a technique for speeding up the process of testing and debugging integrated circuits such as programmable logic devices.

SUMMARY OF THE INVENTION

To achieve the foregoing, and in accordance with the purpose of the present invention, a technique for embedding a microprocessor into an integrated circuit is disclosed that allows on-chip testing and debugging. The present invention allows a circuit element present on the chip itself to test and debug the rest of the chip. Preferably this circuit element is a microprocessor which is capable of storing and executing instructions. The present invention is applicable for testing and debugging of integrated circuits and is especially useful with programmable devices because of the complexity and range of circuits requiring fault coverage.

It is realized that as integrated circuit features become smaller and smaller, it becomes less expensive to place a microprocessor on a chip. While in the past it might have been too expensive to place a microprocessor on a chip just for testing or debugging, it is now more cost effective to place a microprocessor on a chip just for testing and debugging. The result is faster testing and debugging, or more testing and debugging coverage of the device in the same amount of time. More analysis can be performed in the same amount of time resulting in higher quality devices.

With an embedded processor right on the chip, tests, patterns, simulation, etc., may be run right on the device. Because no communication is needed from the chip to the outside world for controlling the testing or debugging, the bottleneck of a serial interface is avoided.

In one embodiment for integrated circuit testing, an embedded microprocessor core is present in the PLD. Test costs are reduced and test coverage is increased, for example, by running through a regression that tests all hard function blocks and then reports status back through a JTAG port, SPI or other port.

In a second embodiment for debugging, an embedded microprocessor core in the PLD aids in the real-time debugging of the system at frequency. The embedded microprocessor is also useful for failure analysis probing of failed systems. Further, the embedded microprocessor can be used to improve the performance of gathering probe data during debugging. Further, the embedded microprocessor gives selective feedback by using enhanced compression techniques, adaptive selection of data based on known patterns and routines, and wider parallel output of data versus using a serial JTAG port interface.

By running testing or debugging routines directly on the PLD using an embedded microprocessor, speed improvements from one thousand times up to one million times may be achieved versus the typical testing or debugging controlled by a test system or a host computer. The resulting data from the on-chip test or debugging routine may be compressed or filtered by the microprocessor to enhance the bandwidth of the communication channel from the chip back to a test system or host computer. The present invention is applicable any integrated circuit that can include an embedded microprocessor and associated memory. By way of example, the present invention is useful with a PLD, an ASIC, a memory chip, or an analog chip.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention is applicable to both the testing and debugging of integrated circuits (devices). Testing of an integrated circuit is performed by the device manufacturer before the device is shipped to a customer, and typically uses a test system. Debugging of the device is performed by the customer who has placed their design onto the device, and who desires to check its functionality before shipping it out as a final product. Debugging is typically controlled by a customer host computer, as is known in the art. In order to develop an electronic design for programming a hardware device, a programmable logic development system is used. As explained above, the present invention is applicable to many types of integrated circuits; the below discussion refers to a "PLD" for ease of explanation.

Programmable Logic Development System

Figure 1:
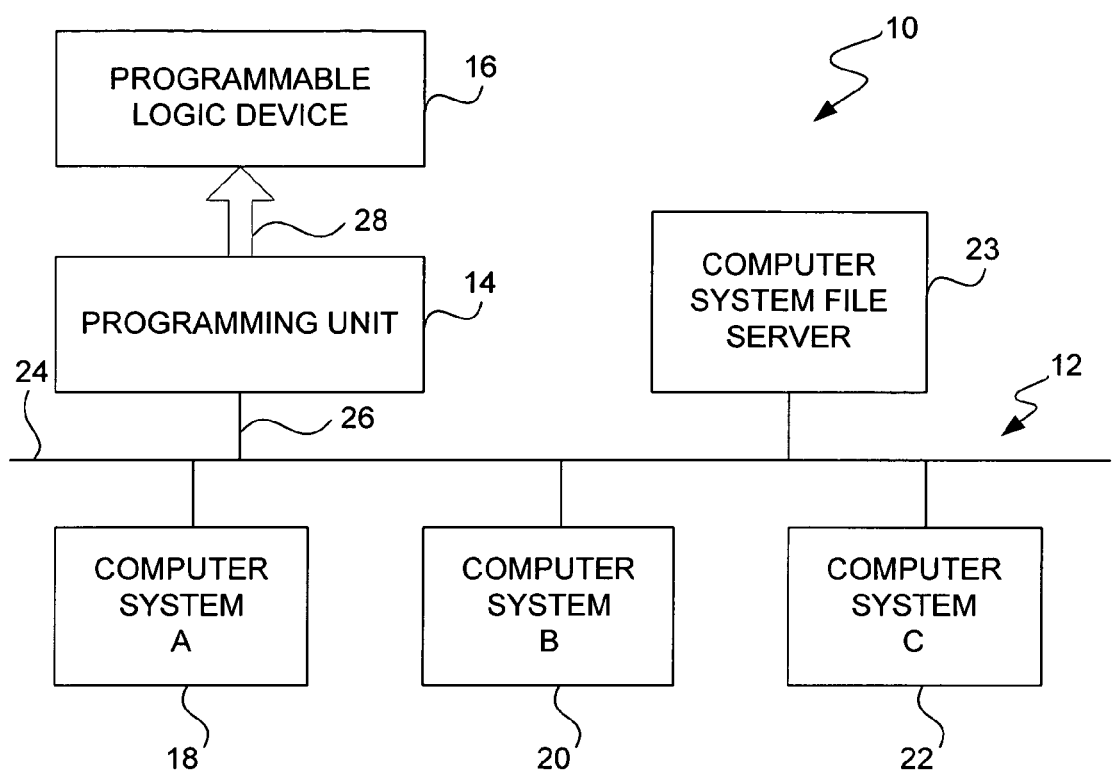
FIG. 1 is a block diagram of a programmable logic development system according to one embodiment of the present invention.

FIG. 1 is a block diagram of an embodiment of a programmable logic development system 10 that includes a computer network 12, a programming unit 14 and a programmable logic device 16 that is to be programmed. Computer network 12 includes any number of computers connected in a network such as computer system A 18, computer system B 20, computer system C 22 and computer system file server 23 all connected together through a network connection 24. Computer network 12 is connected via a cable 26 to programming unit 14, which in turn is connected via a programming cable 28 to the PLD 16. Alternatively, only one computer system might be directly connected to programming unit 14. Furthermore, computer network 12 need not be connected to programming unit 14 at all times, such as when a design is being developed, but could be connected only when PLD 16 is to be programmed.

Programming unit 14 may be any suitable hardware programming unit that accepts program instructions from computer network 12 in order to program PLD 16. By way of example, programming unit 14 may include an add-on logic programmer card for a computer, and a master programming unit, such as are available from Altera Corporation of San Jose, Calif. PLD 16 may be present in a system or in a programming station. In operation, any number of engineers use computer network 12 in order to develop programming instructions using an electronic design automation (EDA) software tool. Once a design has been developed and entered by the engineers, the design is compiled and verified before being downloaded to the programming unit. The programming unit 14 is then able to use the downloaded design in order to program PLD 16.

Any of the computers shown or others may be used by an engineer to compile a design. Furthermore, programming cable 28 may be used to receive data from the PLD, or a separate debugging cable may be used to directly connect a computer with device 16. Such a programmable logic development system is used to create an electronic design. A user creates a design by specifying and implementing functional blocks, as will now be described in the context of an exemplary design methodology.

Design Methodology

Figure 2:
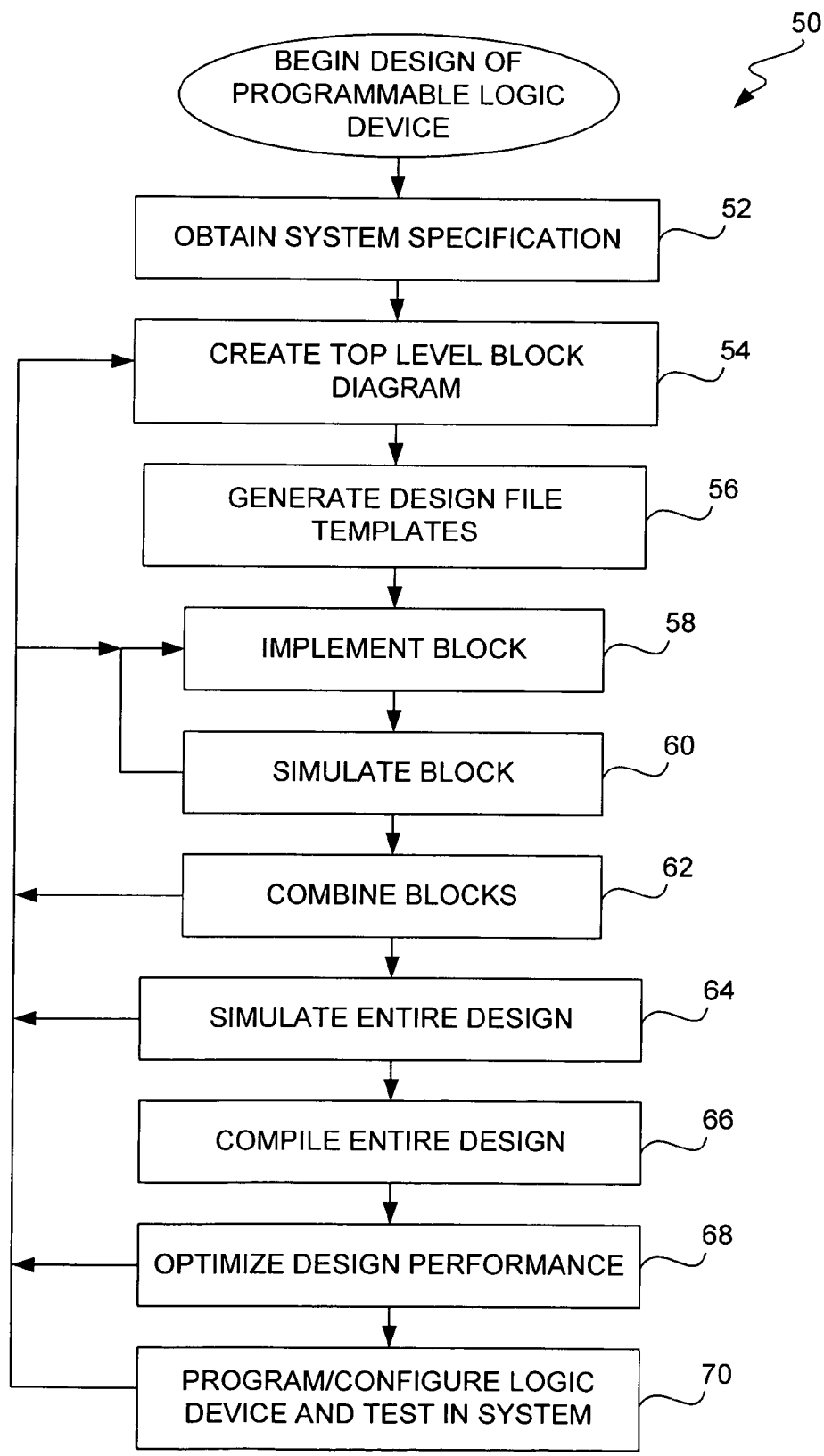
FIG. 2 is a flowchart of a design methodology used to design a programmable logic device (PLD) according to one embodiment of the present invention.

FIG. 2 shows a design methodology 50 for using a system specification in order to develop a design with which to program a PLD.

In step 52 a system specification for the PLD to be programmed is obtained. This specification is an external document or file that describes, for example, the device pin names, the functionality of each of the pins, the desired system functionality, timing and resource budgets, and the like.

In step 54 a top-level block diagram is created in which connections between lower-level design blocks are specified. In this block, the target device, speed grade, and key timing requirements may be specified.

Step 56 includes generating design file templates with the EDA tool for all blocks present in the top-level block diagram of step 54. After the designer has created a block which has not yet been implemented, the system may generate a design file template.

Next, in step 58, each of the blocks of the top-level block is implemented using the EDA tool. It is noted that for more complicated designs, there may be additional levels of block diagrams (i.e., blocks within blocks). If changes are required at the top-level then the top-level block diagram is updated and the sub-designs are preferably automatically updated as well.

In step 60 a block is simulated functionally at the source level using a behavioral simulator and vectors generated by using a VHDL or Verilog test bench, for example. The simulation results can then be displayed or otherwise presented or recorded as waveforms, text or annotated onto the source files. The designer may also return to step 58 to implement a block again. Also, at this point a block may be compiled or a timing analysis performed.

Once the designer is satisfied with the simulation results, in step 62 the block is combined with other blocks and the resulting group is simulated together. In some cases, it may be useful to complete a full compilation to provide critical resource and timing information. Also, output simulation vectors from one block may become the input simulation vectors to the next block. The designer may also return to step 54 to modify the top-level block or to step 58 to implement a block again.

Next, in step 64, the entire design is simulated functionally at the source level using a behavioral simulator. Preferably, the top-level block diagram is fully specified before simulation and shows complete design connectivity. Vectors can be generated using a VHDL or Verilog test bench. Again, the simulation results can be displayed either as waveforms or annotated onto the source files. The designer may also return to step 54 to modify the top-level block or to step 58 to implement a block again. In step 66 the entire design is compiled into a file containing the information needed to program a PLD to implement the user's design.

Following compilation, in step 68 the designer determines if the performance goals for the design have been met by reference to the timing analysis and any simulation. In addition, other analysis tools such as a design profiler or a layout editor can be used to further optimize the design. Preferably, optimization is not performed prior to step 68 because full compilation is usually required to establish the location of one or more critical paths within the design. The designer may also return to step 54 to modify the top-level block or to step 58 to implement a block again.

Next, in step 70 the device is programmed using programming unit 14 and debugged. Now that a general design methodology has been described by which an engineer may develop a design for a PLD, a technique for embedding a microprocessor will be discussed.

Block Diagrams

Figure 3:
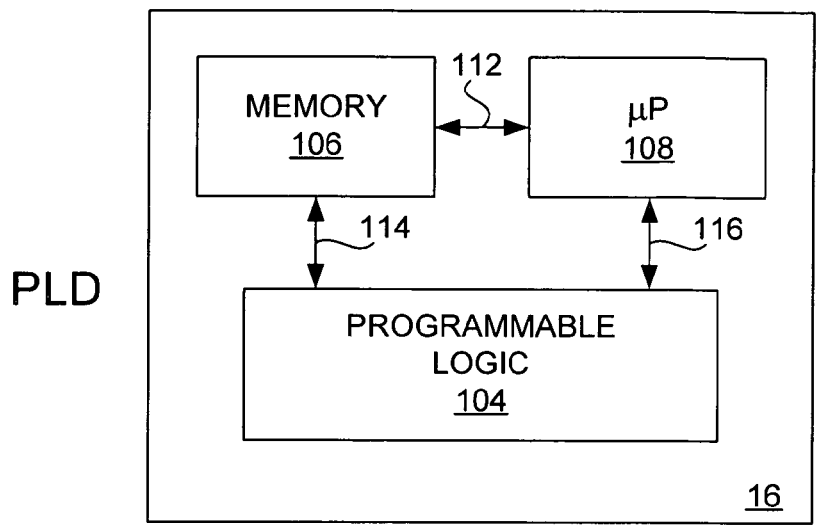
FIG. 3 illustrates in greater detail the PLD of FIG. 1.

FIG. 3 illustrates in greater detail the programmable logic device (PLD) 16 of FIG. 1. In addition to the usual programmable logic 104, PLD 16 includes hardcoded memory 106 and an embedded, hard coded microprocessor 108. Logic 104 may either be test logic that is programmed in by the manufacturer for purposes of testing the device, or may be user logic that is programmed by a design engineer for the purposes of constructing a device for use in a product. Memory 106 stores the code for running any test routines, or any code for a debugging simulator. Memory 106 may be any of a variety of types of memory such as SDRAM, DRAM or flash memory, although memory 106 is typically SRAM memory.

Microprocessor 108 may be any suitable microprocessor able to be embedded into a PLD. Preferably, microprocessor 108 is a standard-cell implementation of a processor, and may be a processor of any instruction set architecture or of any word size. The speed of the microprocessor and its performance may be varied depending upon the testing and debugging speeds necessary, while realizing that a higher performance microprocessor will be more expensive. Microprocessors such as Intel's Pentium, Motorola's Power PC, PMC's SB-1250, or the ARM 9 may be used. In one particular embodiment the NIOS microprocessor available from Altera Corporation is used.

While microprocessor 108 may utilize its own memory, it is preferable that it utilize external memory 106. Alternatively, the general purpose memory of logic 104 may be used to store any testing or debugging routines, but this with the realization that such a technique would take up space in the PLD that might be used for other functions.

Microprocessor 108 includes a memory controller and communicates with memory 106 over an address/data bus 112. Routines are delivered to logic 104 from memory 106 over an internal connection 114 and other control signals may be passed from the microprocessor to logic 104 over connection 116 which likewise is enabled to transmit resulting data to the microprocessor.

PLD 16 of FIG. 3 also preferably includes any of a number of ports such as a JTAG port and general purpose I/O pins that may be used as a parallel port. As is known in the field, PLD 16 includes components such as programmable logic elements, memory blocks, routing resources such as interconnect conductors and programmable connections between the conductors.

Figure 4:
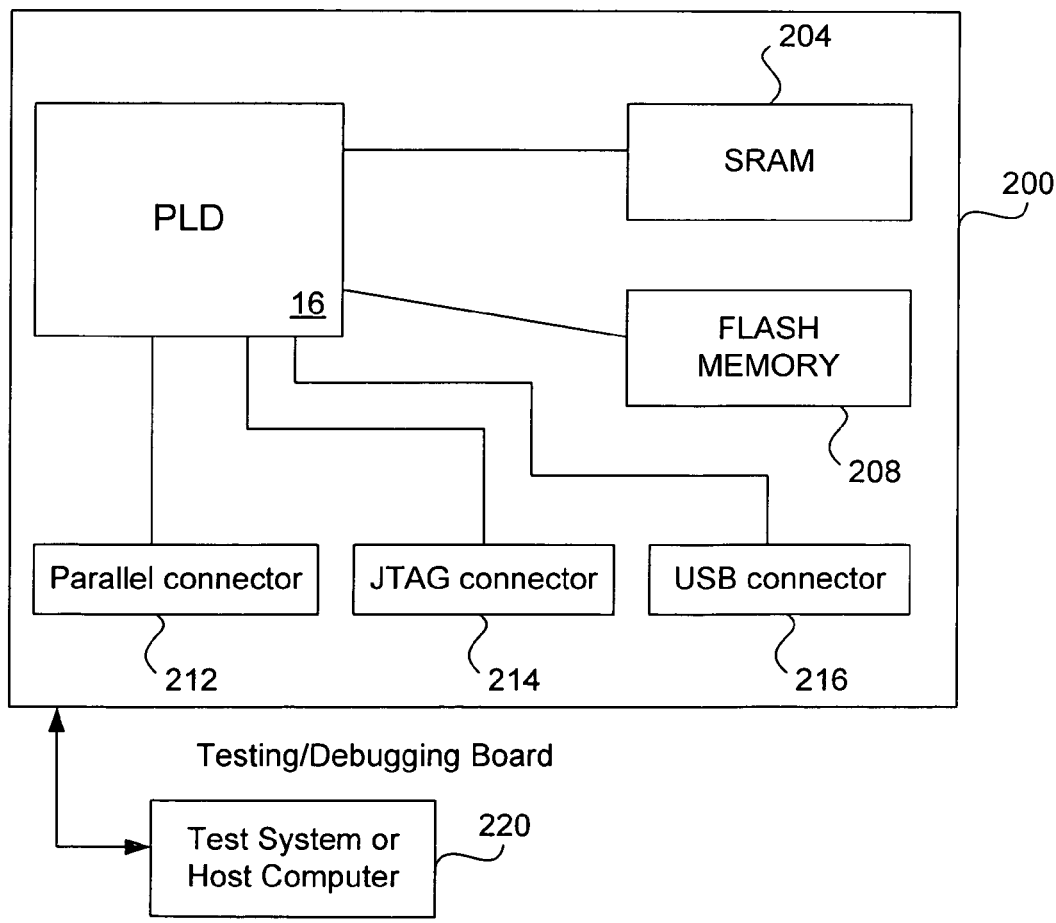
FIG. 4 illustrates a testing or debugging board in which sits a PLD.

FIG. 4 illustrates a testing or debugging board 200 in which sits PLD 16. Also included on board 200 are external memory to PLD—SRAM 204 and flash memory 208. Connected to the microprocessor 108 of the PLD may be any of a variety of communication port connectors used to communicate from the board to the outside world. By way of example, shown are a general-purpose parallel I/O port connector 212, a JTAG connector 214 and a USB connector 216. Through any one of these ports communication is enabled to either a test system (used when the PLD is being tested by the manufacturer), or to a host computer (used by a design engineer to debug the PLD). In addition to a test system or host computer issuing control signals and receiving results, it can also download and program the routines needed into memory 106 of the PLD.

Board 200 is typically referred to as a device under test (DUT) board or a device under debug (DUD) board. In other embodiments, PLD 16 may be mounted into a test socket which may or may not include the elements of 200, or a customer may choose to build a custom board 200 to suit the needs of the PLD which is being debugged. Board 200 may also be the final system board which is the final product containing the PLD to be debugged. When present on the final system board, a design engineer may place a connector onto the PLD or use a dedicated connector on the board in order to debug the PLD using techniques of the present invention immediately before the board is shipped.

In a situation where memory 106 of PLD 16 is not large enough for the routines needed, SRAM 204 may also be used to store routines. PLD 16 may be programmed for either testing or debugging purposes by using the SRAM object file (SOF) or by using the programming object file (POF). When using the SOF, the design is downloaded into SRAM 204 that is then used to program the PLD. When using the POF, the design is downloaded into flash memory 208 that is then used to program the PLD.

Flow Diagrams

Figure 5:
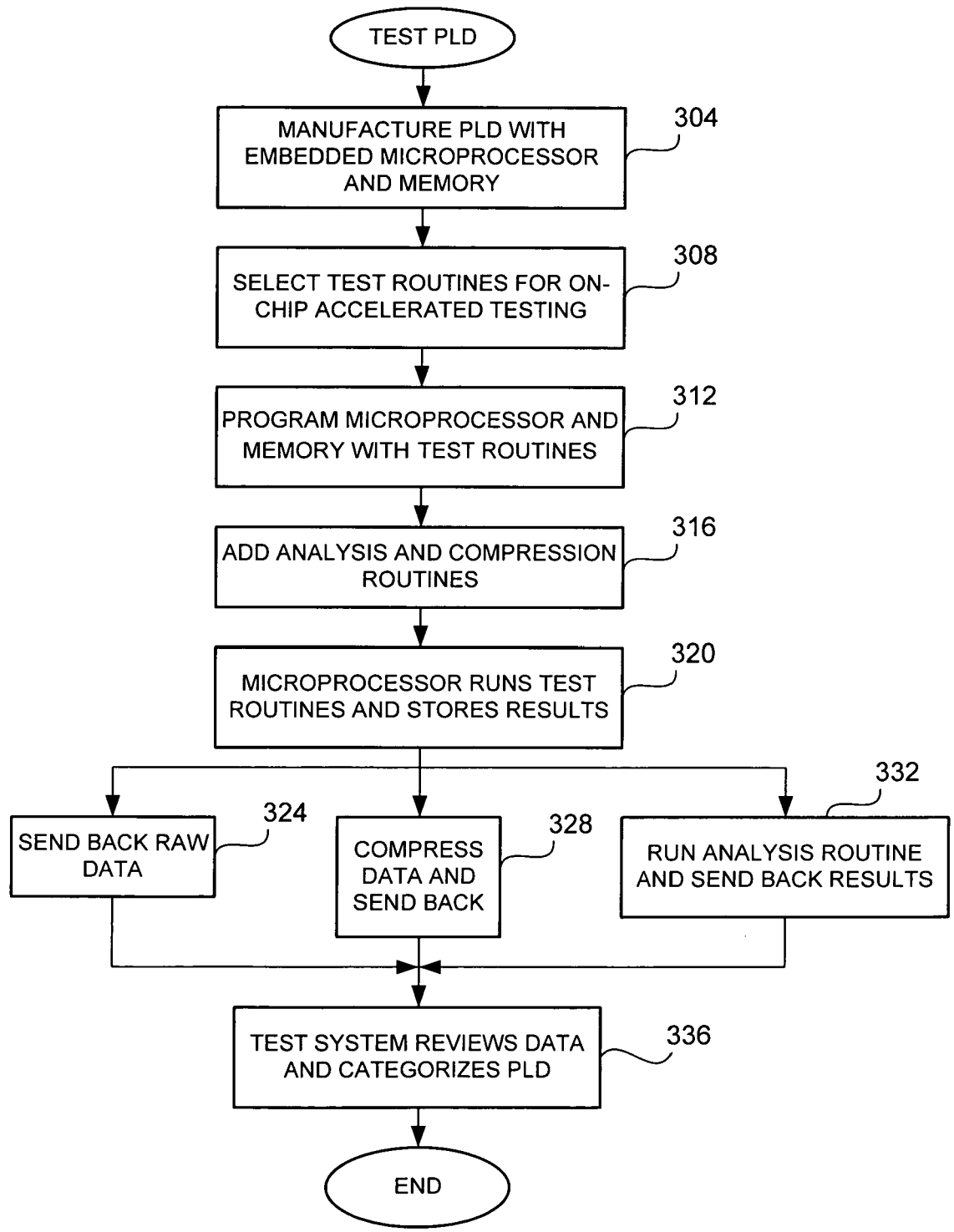
FIG. 5 is a flow diagram illustrating a technique of testing a PLD.

The present invention may be used in conjunction with either a test system for testing of a PLD by the manufacturer, or with a host computer for debugging of the PLD by a customer. FIG. 5 is a flow diagram illustrating a technique of testing the PLD. In step 304 the manufacturer manufactures the PLD and includes an embedded microprocessor and associated memory such as is shown in FIG. 3. Included with the PLD are any suitable ports such as a JTAG port, other serial port, and general I/O pins that may be used for a parallel port.

In step 308 a test engineer selects test routines to be used for on-chip accelerated testing. As is known in the art, these test routines are developed typically by a test engineering department of the manufacturer. Preferably, those most costly test routines are selected for on-chip testing. In step 312 the PLD is placed into the test socket (or other board) and a "configure device for test" procedure is performed. As part of this configuration, the on-chip microprocessor and its associated memory are programmed with the selected test routines. One or many routines may be chosen. The memory holds the selected routine patterns and other test vectors while the microprocessor may be programmed with a control program or control signals. Optionally, in step 316 analysis and compression routines may also be programmed into the microprocessor. An analysis routine enables the on-chip microprocessor to review and analyze the raw data resulting from the testing of the PLD. Such an analysis routine (or other routine present on the microprocessor) may be written in any suitable language for the microprocessor, such as C or the processor's assembly language.

The analysis routine allows the on-chip microprocessor to process the raw data and selectively report intelligent results back to the testing system, thus increasing speed and decreasing the amount of data needed to be communicated back to the test system. A compression routine may be any suitable compression algorithm used to compress the raw data; examples include the Huffman, Adaptive Huffman, LZW (Lempel-Ziv-Welch) and RLE (run length encoding) compression routines.

In step 320 the microprocessor automatically runs the selected test routines to exercise the PLD and to gather information from the tests. The results from these routines are stored in the microprocessor memory or in memory 106 if needed. The stored results may be varied. By way of example, results include whether circuit elements are functioning or not functioning, parametric results indicating the speed of certain paths or whether certain paths have equivalent speeds, memory test results, and other device characteristics. In step 324 the microprocessor sends back this stored raw data to the test system over the communication link. Alternatively, in step 328 the microprocessor may use a compression routine to compress the raw data before sending it back to the test system, thus decreasing the amount of information to be sent. Or, in another embodiment, an analysis routine is run in step 322 to intelligently analyze the raw data. Once the routine has determined its conclusions, it sends this information back to the test system. In step 336 the test system automatically reviews either the raw data and analyzes it, or reviews the results from the analysis routine and determines how to categorize the PLD. By way of example, the PLD is categorized as either passing or failing, is categorized based on a range of functionality, or is characterized based on speed results. The PLD is then automatically placed into a particular bin depending upon the results.

Figure 6:
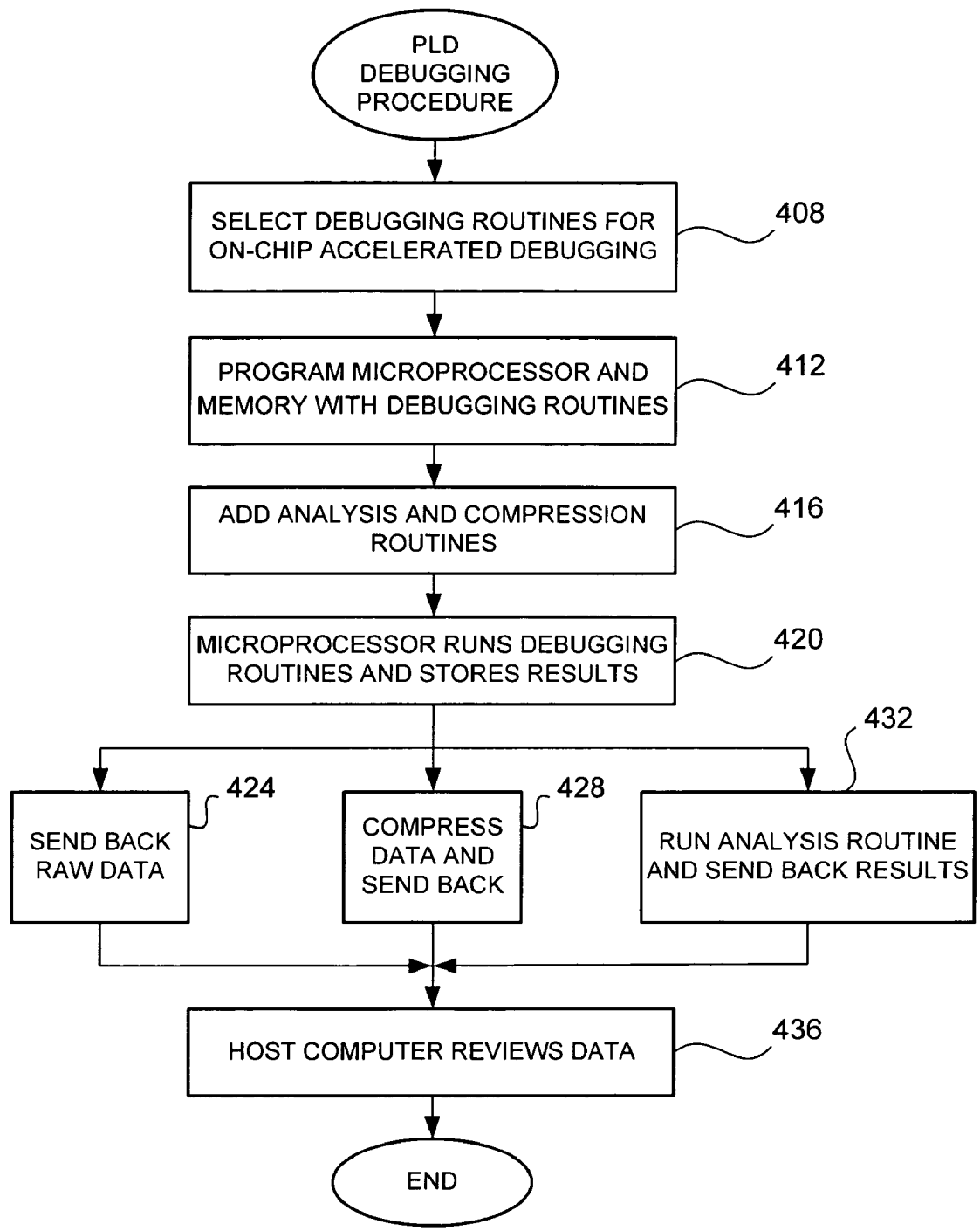
FIG. 6 is a flow diagram illustrating a technique of debugging a PLD.

FIG. 6 is a flow diagram illustrating a technique of debugging the PLD. As previously mentioned, the manufactured PLD includes an embedded microprocessor and associated memory such as is shown in FIG. 3. Included with the PLD are any suitable ports such as a JTAG port, other serial port, and general I/O pins that may be used for a parallel port.

In step 408 a design engineer selects debugging routines to be used for on-chip accelerated debugging. As is known in the art, these debug routines are developed typically by design engineers who are familiar with the electronic design to be programmed into the PLD. These routines are typically derived from the simulation test bench.

Preferably, those most costly debug routines are selected for debugging. In step 412 the PLD is placed into the test socket (or custom board or the final system board). The on-chip microprocessor and its associated memory are then programmed with the selected debug routines. One or many routines may be chosen. The memory holds the selected routines, patterns or debug vectors while the microprocessor may be programmed with a control program or control signals. Optionally, in step 416 analysis and compression routines may also be programmed into the microprocessor. An analy-sis routine would enable the on-chip microprocessor to review and analyze the raw data resulting from the debugging of the PLD.

The analysis routine allows the on-chip microprocessor to process the raw data and selectively report intelligent results back to the host computer, thus increasing speed and decreasing the amount of data needed to be communicated back to the host computer. A compression routine may be any suitable compression algorithm used to compress the raw data.

In step 420, the microprocessor automatically runs the selected debugging routines to debug the PLD and to gather information. The results from these routines are stored in the microprocessor memory or in memory 106 if needed. The results stored may be varied. By way of example, one type of result is the result of comparing a complex multiplier routine using on-chip hardware multipliers against the true result.

In step 424, the microprocessor sends back this stored raw data to the host computer over a communication link. Alternatively, in step 428 the microprocessor may use a compression routine to compress the raw data before sending it back to the host computer, thus decreasing the amount of information to be sent. Or, in another embodiment, an analysis routine is run in step 422 to intelligently analyze the raw data. Once the routine has determined its conclusions, it sends this information back to the host computer. In step 436, the host computer allows the design engineer to view the results to determine a next step in debugging. For example, the PLD may be deemed acceptable, more debugging routines may need to be run, or the engineer may decide to change the design and reprogram the PLD for further debugging.

Computer System Embodiment

Figure 7A:
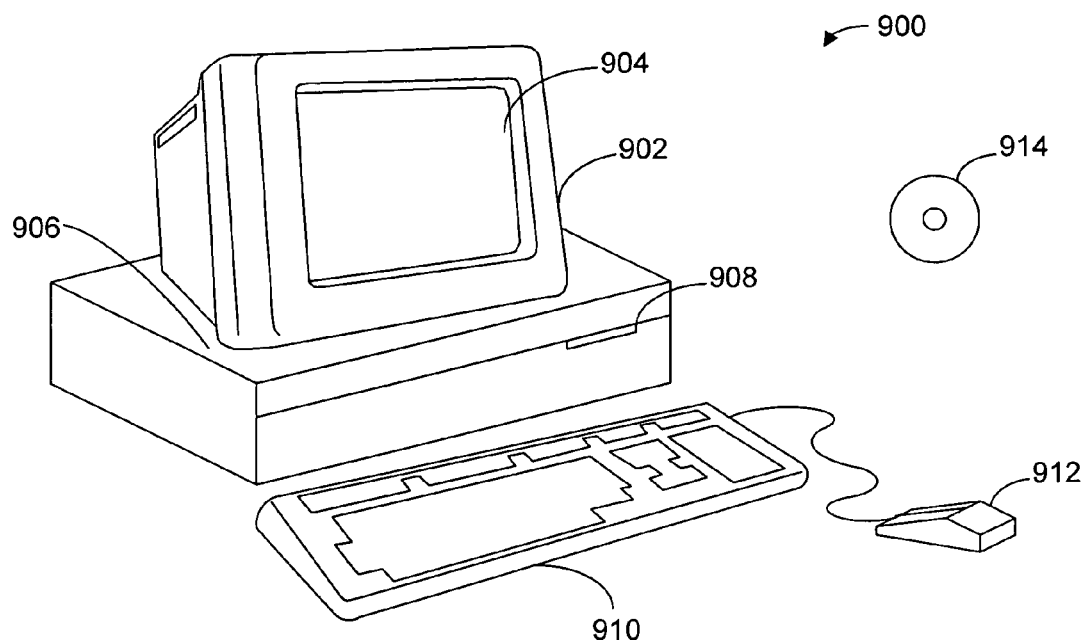
FIGS. 7A and 7B illustrate a computer system suitable for implementing embodiments of the present invention.
Figure 7B:
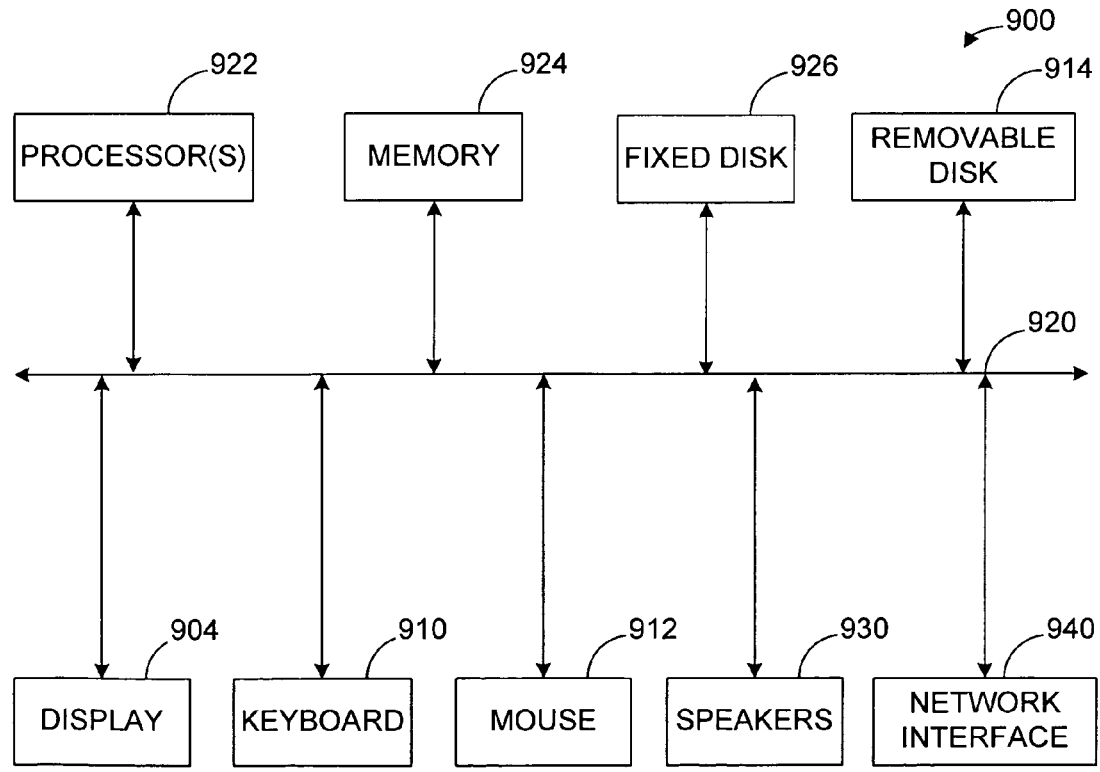

FIGS. 7A and 7B illustrate a computer system 900 suitable for implementing embodiments of the present invention, such as the computers of FIG. 1, a test system or a host computer. FIG. 7A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 7B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A programmable logic device (PLD) comprising:
   programmable logic that includes test logic;
   a port for external communication;
   a hard-coded microprocessor embedded within the programmable logic device and in communication with said programmable logic; and
   memory that includes a test routine, said memory being in communication with said microprocessor and said programmable logic, whereby said test logic is tested using said test routine under control of said microprocessor.

2. A PLD as recited in claim 1 wherein said port is a parallel port, a serial port, a USB port or a JTAG port.

3. A PLD as recited in claim 1 wherein said memory is part of said programmable logic.

4. A PLD as recited in claim 1 wherein said memory is part of said microprocessor.

5. A PLD as recited in claim 1 wherein said microprocessor includes an analysis routine for analyzing results of said test routine.

6. A PLD as recited in claim 1 wherein said microprocessor includes a control routine for controlling execution of said test routine.

7. A programmable logic device (PLD) comprising:
   programmable logic that includes user logic;
   a port for external communication;
   a hard-coded microprocessor embedded within the programmable logic device and in communication with said programmable logic; and
   memory that includes a debugging routine, said memory being in communication with said microprocessor and said programmable logic, whereby said user logic is debugged using said debugging routine under control of said microprocessor.

8. A PLD as recited in claim 7 wherein said port is a parallel port, a serial port, a USB port or a JTAG port.

9. A PLD as recited in claim 7 wherein said memory is part of said programmable logic.

10. A PLD as recited in claim 7 wherein said memory is part of said microprocessor.

11. A PLD as recited in claim 7 wherein said microprocessor includes an analysis routine for analyzing results of said debugging routine.

12. A PLD as recited in claim 7 wherein said microprocessor includes a control routine for controlling execution of said debugging routine.

13. A method of testing a programmable logic device (PLD), said method comprising:
    manufacturing a PLD that includes programmable logic, an embedded microprocessor and associated memory;
    downloading to said memory a test routine;
    executing said test routine under control of said microprocessor to test said programmable logic;
    storing raw data resulting from execution of said test routine; and
    sending results based on said raw data of said test routine from said microprocessor to a test system external to said PLD, whereby said test system determines the functionality of said PLD.

14. A method as recited in claim 13 further comprising:
    downloading to said microprocessor a control routine for controlling execution of said test routine.

15. A method as recited in claim 13 wherein said results are said raw data.

16. A method as recited in claim 13 further comprising:
    downloading to said microprocessor an analysis routine for analyzing said raw data from said test routine; and
    executing said analysis routine to produce said results, wherein said results reflect conclusions based on said raw data.

17. A method as recited in claim 13 further comprising:
    downloading to said microprocessor a compression routine for compressing said raw data from said test routine;
    compressing said raw data; and
    sending said compressed raw data as said results.

18. A method as recited in claim 13 wherein said associated memory is part of said programmable logic.

19. A method as recited in claim 13 wherein said associated memory is part of said microprocessor.

20. A method of debugging a programmable logic device (PLD), said method comprising:
    mounting in a test socket a PLD that includes user logic, an embedded microprocessor and associated memory;
    downloading to said memory a debugging routine;
    executing said debugging routine under control of said microprocessor to debug said user logic;
    storing raw data resulting from execution of said debugging routine; and
    sending results based on said raw data of said debug routine from said microprocessor to a host computer external to said PLD, whereby said host computer determines the functionality of said PLD.

21. A method as recited in claim 20 further comprising:
downloading to said microprocessor a control routine for controlling execution of said debugging routine.

22. A method as recited in claim 20 wherein said results are said raw data.

23. A method as recited in claim 20 further comprising:
downloading to said microprocessor an analysis routine for analyzing said raw data from said debugging routine; and executing said analysis routine to produce said results, wherein said results reflect conclusions based on said raw data.

24. A method as recited in claim 20 further comprising:
downloading to said microprocessor a compression routine for compressing said raw data from said debugging routine;

compressing said raw data; and sending said compressed raw data as said results.

25. A method as recited in claim 20 wherein said associated memory is part of said user logic.

26. A method as recited in claim 20 wherein said associated memory is part of said microprocessor.

* * * * *